(12) United States Patent
Tsunoda

(10) Patent No.: US 8,169,347 B2
(45) Date of Patent: May 1, 2012

(54) PARALLEL-TO-SERIAL CONVERTER AND PARALLEL DATA OUTPUT DEVICE

(75) Inventor: Yukito Tsunoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/884,498

(22) Filed: Sep. 17, 2010

(65) Prior Publication Data

US 2011/0068959 A1    Mar. 24, 2011

(30) Foreign Application Priority Data

Sep. 18, 2009    (JP) .................................. 2009-217542

(51) Int. Cl.
*H03M 9/00*    (2006.01)

(52) U.S. Cl. ........................................ 341/101; 341/100

(58) Field of Classification Search .................. 341/101, 341/100
See application file for complete search history.

(56) References Cited

U.S. PATENT DOCUMENTS

| | | | |
|---|---|---|---|
| 5,477,178 A | 12/1995 | Maki | |
| 5,726,990 A * | 3/1998 | Shimada et al. | 370/536 |
| 6,335,696 B1 * | 1/2002 | Aoyagi et al. | 341/100 |
| 6,400,200 B2 | 6/2002 | Sasaki | |
| 6,614,371 B2 * | 9/2003 | Zhang | 341/101 |
| 6,696,995 B1 * | 2/2004 | Foley et al. | 341/100 |
| 7,135,899 B1 * | 11/2006 | Sancheti et al. | 327/144 |
| 7,212,744 B2 | 5/2007 | Shiramizu et al. | |
| 7,551,107 B2 * | 6/2009 | Shim et al. | 341/101 |
| 7,990,294 B2 * | 8/2011 | Doi et al. | 341/101 |
| 7,990,296 B1 * | 8/2011 | Wang et al. | 341/101 |

FOREIGN PATENT DOCUMENTS

| | | |
|---|---|---|
| JP | 4-263534 A | 9/1992 |
| JP | 7-58207 | 3/1995 |
| JP | 2002-26726 A | 1/2002 |
| JP | 2002-204448 | 7/2002 |
| JP | 2004-236084 A | 8/2004 |
| JP | 2005-79835 A | 3/2005 |

OTHER PUBLICATIONS

Behzad, Razavi "Design of Integrated Circuits for Optical Communications", International Edition 2003, (McGraw-Hill higher Education), Dec. 31, 2003, pp. 333-339.
Kouichi, Kanda et al., "A Single-40Gb/s Dual-20Gb/s Serializer IC with SFI5.2 Interface in 65nm CMOS", ISSCC 2009 / Session 21 / 10Gb/s-TO-40Gb/s Transmitters and Receivers/ 21.2, 2009 IEEE International Solid-State Circuits Conference, Dec. 11, 2009, 3 pages.
Japanese Office Action mailed Jan. 24, 2012 for corresponding Japanese Application No. 2009-217542, with Partial English-language Translation.

* cited by examiner

*Primary Examiner* — Khai M Nguyen
(74) *Attorney, Agent, or Firm* — Fujitsu Patent Center

(57) ABSTRACT

A parallel data output device includes a first latch circuit that latches and outputs one of at least two data signals input in parallel in accordance with a first clock signal; a second latch circuit that latches and outputs another of the at least two data signals in accordance with a second clock signal; and a phase set circuit that shifts at least one of a phase of the first clock signal and a phase of the second clock signal based on the phase of the first clock signal and the phase of the second clock signal.

9 Claims, 15 Drawing Sheets

RELATED ART

PARALLEL-TO-SERIAL CONVERTER AND PARALLEL DATA OUTPUT DEVICE

CROSS-REFERENCE TO RELATED APPLICATIONS

The application is based upon and claims the benefit of priority of the prior Japanese Patent Application No. 2009-217542, filed on Sep. 18, 2009, the entire contents of which are incorporated herein by reference.

FIELD

The embodiments discussed herein are related to parallel-to-serial converter and parallel data output device in a communication network.

BACKGROUND

In optical communication networks using optical fibers, an increase in the amount of communication data has pushed up the data rate. Optical signals carrying high-speed data over, for example, 10 Gb/s, which are communicated via optical communication networks, are generated by driving optical modulators by electrical signals including the above data. As an example, a data signal that is an electrical signal for driving an optical modulator having a Mach-Zehnder configuration is generated through parallel-to-serial conversion performed on a plurality of parallel data signals to produce a single serial data signal. FIG. 6 illustrates a parallel-to-serial converter, and FIG. 7 illustrates a timing chart of the parallel-to-serial converter. The circuit illustrated in FIG. 6 is illustrated in, for example, "Design of Integrated Circuits for Optical Communications", Behzad Razavi, International Edition 2003, (Singapore), McGraw-Hill Education, 2003, pp. 333-339.

The parallel-to-serial converter in FIG. 6 is a circuit that converts two input data signals IN0 and IN1, which are input in parallel, into a single serial signal to generate an output data signal OUT whose data rate is twice that of the input signals.

The input data signal IN0 is latched sequentially by three cascade-connected flip-flops 1-1, 1-2, and 1-3, and is input to a selection circuit (selector) 2 as a selection data signal D0. The input data signal IN1 is latched sequentially by two cascade-connected flip-flops 1-4 and 1-5, and is input to the selection circuit 2 as a selection data signal D1. Each of the flip-flops 1-1 to 1-5 serving as latch circuits operates in accordance with a frequency-divided clock signal divCLK that is obtained using a frequency divider circuit 3 by dividing the frequency of a clock signal CLK whose frequency corresponds to the data rate of the output data signal OUT by ½. The flip-flops 1-2 and 1-5 execute setup and hold operations in accordance with a rising edge of the frequency-divided clock signal divCLK, and the flip-flops 1-1, 1-3, and 1-4 execute setup and hold operations in accordance with a falling edge of the frequency-divided clock signal divCLK.

Therefore, the input data signals IN0 and IN1 are captured into the flip-flops 1-1 and 1-4, respectively, in accordance with a falling edge of the frequency-divided clock signal divCLK. The input data signals IN0 and IN1 are sequentially sent to the subsequent flip-flops 1-2, 1-3, and 1-5 for every half period of the frequency-divided clock signal divCLK. The selection data signal D0 output through the three flip-flops 1-1, 1-2, and 1-3, and the selection data signal D1 output through the two flip-flops 1-4 and 1-5 are input to the selection circuit 2 as signals whose phases are different by 180° from each other. In this manner, the timing at which the selection data signals D0 and D1 are input to the selection circuit 2 is adjusted using the flip-flops 1-1 to 1-5 that are included in an input circuit.

The frequency-divided clock signal divCLK is supplied to the selection circuit 2 as a switching clock signal. The selection circuit 2 performs a switching operation in accordance with the frequency-divided clock signal divCLK to alternately select the selection data signals D0 and D1 to perform serial conversion to produce a conversion data signal D[0+1], and outputs the conversion data signal D[0+1]. The selection circuit 2 selects the selection data signal D0 in accordance with a rising edge of the frequency-divided clock signal divCLK, and selects the selection data signal D1 in accordance with a falling edge of the frequency-divided clock signal divCLK. Therefore, the conversion data signal D[0+1] output from the selection circuit 2 is output as a serial data signal whose frequency corresponds to the frequency of the clock signal CLK whose frequency has not been divided.

The conversion data signal D[0+1] is latched in a flip-flop 4 that performs a latch operation in accordance with an output clock signal ffCLK having substantially the same cycle as the clock signal CLK, and the output data signal OUT is output from the flip-flop 4. The flip-flop 4 serving as an output circuit executes setup and hold operations in accordance with a rising edge of the output clock signal ffCLK.

As illustrated in the timing chart of FIG. 7, the conversion data signal D[0+1] output from the selection circuit 2 is a data signal in which the selection data signal D0 and the selection data signal D1 are alternately switched with the width of one pulse of the frequency-divided clock signal divCLK. Further, the phases of the clock signals ffCLK and divCLK, which are generated based on the clock signal CLK, are designed so that a rising edge of the output clock signal ffCLK whose frequency is twice that of the frequency-divided clock signal divCLK is located at the center of each pulse of the frequency-divided clock signal divCLK. This enables the flip-flop 4 to accurately latch data at optimum points (the center of pulses) of the conversion data signal D[0+1] and to output a normal output data signal OUT.

However, a phase error with respect to the design, that is, a phase deviation, may occur between the frequency-divided clock signal divCLK and the output clock signal ffCLK because the frequency-divided clock signal divCLK output from the frequency divider circuit 3 is supplied to a large number of elements through a buffer BUF, because there is a difference between wiring capacitances caused by the different wiring lengths of the output clock signal ffCLK and the frequency-divided clock signal divCLK, and other reasons.

If a phase deviation occurs between the output clock signal ffCLK supplied to the flip-flop 4 and the frequency-divided clock signal divCLK for outputting the conversion data signal D[0+1], accurate data is not output. This will be described with reference to FIGS. 8A and 8B. FIGS. 8A and 8B are timing charts illustrating the waveform of the conversion data signal D[0+1] and the waveform of the output clock signal ffCLK. FIG. 8A illustrates the waveforms under normal conditions, and FIG. 8B illustrates the waveforms when a phase deviation occurs.

The conversion data signal D[0+1] is output for a cycle corresponding to the pulse width of one half period of the frequency-divided clock signal divCLK. Thus, if a rising edge of the output clock signal ffCLK is within a given margin (allowed range) according to the pulse width, normal data is latched in the flip-flop 4 (FIG. 8A). However, if a phase deviation occurs between the frequency-divided clock signal divCLK and the output clock signal ffCLK because of the above reasons and abnormal data is latched in the flip-flop 4

(FIG. 8B) due to this phase deviation, a rising edge of the output clock signal ffCLK is out of the margin.

As described above, with an increase in data rate, the rate of the clock signal CLK increases and the pulse width of the frequency-divided clock signal divCLK and the output clock signal ffCLK, which are generated based on the clock signal CLK, is reduced. Then, the margins illustrated in FIGS. 8A and 8B become small. It is therefore desirable that the timing at which the above clock signals are input to the respective circuits be set accurately. A technology for providing a replica circuit to facilitate phase matching is proposed in, for example, "A Single-40 Gb/s Dual-20 Gb/s Serializer IC with SFI5.2 Interface in 65 nm CMOS", Kouichi Kanda, et al., ISSCC 2009/SESSION 21/10 Gb/s-T0-40 Gb/s TRANSMITTERS AND RECEIVERS/21.2, 2009 IEEE International Solid-State Circuits Conference. FIG. 9 illustrates a parallel-to-serial converter including the above replica circuit.

In the parallel-to-serial converter illustrated in FIG. 9, a conversion circuit for performing parallel-to-serial conversion on input data signals IN0 and IN1 to generate an output data signal OUT (that is, flip-flops 1-1 to 1-5 in an input circuit, a selection circuit 2, a frequency divider circuit 3, and a flip-flop 4 in an output circuit) is substantially the same as that in the parallel-to-serial converter illustrated in FIG. 6. A clock signal CLK, a frequency-divided clock signal divCLK, and an output clock signal ffCLK are also substantially the same as those in FIG. 6.

The replica circuit includes a selection circuit (replica selection circuit) 10 that selects one of replica input data signals repIN0 and repIN1 in accordance with the frequency-divided clock signal divCLK, and a flip-flop 11 in a replica output circuit that latches a replica conversion data signal repD, which is obtained through serial conversion and output from the selection circuit 10, in accordance with a replica clock signal repCLK.

The selection circuit 10 has substantially the same structure as the selection circuit 2, and substantially the same signal as the frequency-divided clock signal divCLK supplied to the selection circuit 2 is supplied as a switching clock signal. Further, the flip-flop 11 also has the same structure as the flip-flop 4. Like the output clock signal ffCLK supplied to the flip-flop 4, the replica clock signal repCLK supplied to the flip-flop 11 is a signal having substantially the same cycle as the clock signal CLK. However, the flip-flop 11 executes setup and hold operations in accordance with a falling edge of the replica clock signal repCLK. In this manner, the selection circuit 10 and the flip-flop 11 are replicas of the selection circuit 2 and the flip-flop 4, respectively.

In the replica circuit, a replica output data signal repOUT output from the flip-flop 11 is latched in accordance with a latch clock signal latCLK output from the frequency divider circuit 3. The phase of the frequency-divided clock signal generated from the frequency divider circuit 3 is adjusted using this latched value.

The replica output data signal repOUT output from the flip-flop 11 is captured into a flip-flop 12 provided as a latch circuit. The flip-flop 12 performs a latch operation in accordance with the latch clock signal latCLK output from the frequency divider circuit 3 whose frequency has been divided by half the frequency of the clock signal CLK. Then, the flip-flop 12 executes setup and hold operations in accordance with a rising edge of the latch clock signal latCLK. The data latched in the flip-flop 12 is supplied to a counter 13 (see "A Single-40 Gb/s Dual-20 Gb/s Serializer IC with SFI5.2 Interface in 65 nm CMOS", Kouichi Kanda, et al., ISSCC 2009/SESSION 21/10 Gb/s-T0-40 Gb/s TRANSMITTERS AND RECEIVERS/21.2, 2009 IEEE International Solid-State Circuits Conference; FIG. 21.2.3, U/D counter). The counter 13 counts up or counts down in accordance with the output value of the flip-flop 12 in synchronization with the latch clock signal latCLK produced by the frequency divider circuit 3. For example, in accordance with a rising edge of the latch clock signal latCLK, the count value is increased by 1 if the current output value of the flip-flop 12 is "1" (high level), and the count value is decreased by 1 if the output value is "0" (low level). The flip-flop 12 serving as a latch circuit and the counter 13 form a phase deviation detection circuit that generates a phase adjustment instruction value signal based on the replica output data signal repOUT.

The count value output from the counter 13 as a phase adjustment instruction value signal is decoded at a desired time using a decoder 14, and is converted into an appropriate code (for example, a thermometer code). Based on the code, an arbitrary phase generation circuit 15 adjusts the phase of the frequency-divided clock signal output from the frequency divider circuit 3 (see "A Single-40 Gb/s Dual-20 Gb/s Serializer IC with SFI5.2 Interface in 65 nm CMOS", Kouichi Kanda, et al., ISSCC 2009/SESSION 21/10 Gb/s-T0-40 Gb/s TRANSMITTERS AND RECEIVERS/21.2, 2009 IEEE International Solid-State Circuits Conference; FIG. 21.2.3, PI: Phase Interpolator), and generates a frequency-divided clock signal divCLK. The arbitrary phase generation circuit 15 serving as a phase interpolation circuit outputs a frequency-divided clock signal divCLK whose phase has been adjusted, by, for example, weighting multiphase frequency-divided clock signals having substantially the same cycle as the frequency-divided clock signal output from the frequency divider circuit 3 and having phases different by 90° from each other in accordance with the code supplied from the decoder 14 and superposing the weighted clock signals.

FIG. 10 illustrates a timing chart of the parallel-to-serial converter in FIG. 9.

The replica input data signals repIN0 and repIN1 are input as data signals one of which is fixed to "0" and the other of which is fixed to "1". Therefore, the replica conversion data signal repD output from the selection circuit 10 transitions between "0" and "1" every half period of the frequency-divided clock signal divCLK. The flip-flop 11 performs a latch operation in accordance with a falling edge of the replica clock signal repCLK whose frequency is twice that of the frequency-divided clock signal divCLK. Thus, the flip-flop 11 executes a latch for the transition period of the replica conversion data signal repD, and generates a replica output data signal repOUT. Therefore, in the replica output data signal repOUT that is latched in and output from the flip-flop 11, "0" and "1" appear randomly. Specifically, a fine change of the transition timing of the replica conversion data signal repD with respect to the latch timing of the flip-flop 11 and a fine change of the signal level of the replica conversion data signal repD at the latch timing cause the replica output data signal repOUT not to appear in a predictable pattern. That is, "0" and "1" appear with substantially the same probability.

The flip-flop 12 that latches the replica output data signal repOUT operates in accordance with the latch clock signal latCLK output from the frequency divider circuit 3. The latch clock signal latCLK is a signal that has just been output from the frequency divider circuit 3, that is, a signal that has not yet passed through the arbitrary phase generation circuit 15 or the buffer BUF, and the phase does not substantially change with respect to the clock signal CLK (that is, the replica clock signal repCLK). The flip-flop 12 that operates in accordance with the latch clock signal latCLK is allowed to execute a latch at any timing out of the transition period of the replica output data signal repOUT. Since, as described above, the replica output data signal repOUT latched in the flip-flop 12 is a data signal in which "0" and "1" appear randomly, the flip-flop 12 may latch "0" or "1" with substantially the same probability.

As a result of "0" or "1" being latched in the flip-flop 12 with substantially the same probability, the count value of the counter 13 that counts the value "0" or "1" is maintained at a substantially constant value and is made stable although the count value may go up and down slightly. In accordance with the stable count value, a decoding value output from the decoder 14 is also made stable, and the frequency-divided clock signal divCLK output from the arbitrary phase generation circuit 15 in accordance with the decoding value is made stable.

FIGS. 11A and 11B illustrate timing charts when a phase deviation occurs between the frequency-divided clock signal divCLK and the replica clock signal repCLK (that is, the output clock signal ffCLK) due to the reasons described above. FIG. 11A illustrates a result obtained when the phase of the replica clock signal repCLK is delayed with respect to the frequency-divided clock signal divCLK, and FIG. 11B illustrates a result obtained when the phase of the replica clock signal repCLK is advanced with respect to the frequency-divided clock signal divCLK. The output clock signal ffCLK and the replica clock signal repCLK may be regarded as the same signal based on the clock signal CLK. Therefore, the replica clock signal repCLK is illustrated in FIGS. 11A and 11B, by way of example.

As described above, there is substantially no phase deviation between the replica clock signal repCLK and the latch clock signal latCLK. Thus, in FIG. 11A, the phase of the frequency-divided clock signal divCLK may be regarded as being deviated ahead of the replica clock signal repCLK and the latch clock signal latCLK. The replica conversion data signal repD transitions in response to the frequency-divided clock signal divCLK while the flip-flop 11 performs a latch operation in response to the replica clock signal repCLK. Thus, if the phases of the clock signals divCLK and repCLK are deviated from each other, a deviation may occur in the latch timing of the flip-flop 11 with respect to the transition period of the replica conversion data signal repD. If the latch timing is not within the transition period, the values latched in the flip-flop 11 do not appear randomly but repetitions of "0" and "1" according to the replica conversion data signal repD may occur. Therefore, the replica output data signal repOUT may be a data signal in which "0" and "1" repeatedly appear every period of the replica clock signal repCLK.

The flip-flop 12 that performs a latch operation in response to the latch clock signal latCLK in which substantially no phase deviation occurs from the replica clock signal repCLK captures the replica output data signal repOUT on every other pulse because the latch clock signal latCLK has a cycle that is twice as that of the replica clock signal repCLK. In FIG. 11A, only the values "0" of the replica output data signal repOUT are latched. Consequently, the output of the flip-flop 12, which is indicated by "FF12" in FIG. 11A, is maintained at "0". The counter 13 decreases the count value in accordance with this output. Thus, the arbitrary phase generation circuit 15 that operates in accordance with the count value and the decoding value delays the phase of the frequency-divided clock signal divCLK. Finally, the timing of each clock signal is adjusted to an optimum timing in FIG. 10.

In FIG. 11B, the phase of the frequency-divided clock signal divCLK may be regarded as being deviated and delayed with respect to the replica clock signal repCLK and the latch clock signal latCLK. In this case, the flip-flop 12 in FIG. 11B, which captures the replica output data signal repOUT on every other pulse, latches only the values "1" of the replica output data signal repOUT. Consequently, the output of the flip-flop 12, which is indicated by "FF12" in FIG. 11B, is maintained at "1". The counter 13 increases the count value in accordance with this output. Thus, the arbitrary phase generation circuit 15 that operates in accordance with the count value and the decoding value advances the phase of the frequency-divided clock signal divCLK. Finally, the timing of each clock signal is adjusted to an optimum timing in FIG. 10.

In some cases, a parallel-to-serial converter including the replica circuit described above may be provided with a plurality of conversion circuits each of which performs parallel-to-serial conversion on a data signal, that is, a plurality of conversion circuits each including the flip-flops 1-1 to 1-5 in the input circuit, the selection circuit 2, and the flip-flop 4 in the output circuit. In such cases, the plurality of conversion circuits are driven simultaneously through clock phase adjustment using a single replica circuit. FIG. 12 illustrates this parallel-to-serial converter.

The clock signals used in the parallel-to-serial converter in FIG. 12 are similar to the corresponding clock signals in FIG. 9. Further, a replica circuit including a selection circuit 10, flip-flops 11 and 12, a counter 13, a decoder 14, and an arbitrary phase generation circuit 15, and a frequency divider circuit 3 are also substantially the same as those in FIG. 9.

In FIG. 12, two conversion circuits each of which converts a parallel data signal into a serial data signal are provided. A first conversion circuit includes flip-flops 1-1a to 1-5a in an input circuit that latch input data signals IN0a and IN1a in accordance with a frequency-divided clock signal divCLK produced by the arbitrary phase generation circuit 15, a selection circuit 2a that selects one of selection data signals D0a and D1a in accordance with the frequency-divided clock signal divCLK, and a flip-flop 4a in an output circuit that latches a conversion data signal D[0+1]a in accordance with an output clock signal ffCLK and that outputs an output data signal OUTa. A second conversion circuit has substantially the same structure, and includes flip-flops 1-1b to 1-5b in an input circuit that latch input data signals IN0b and IN1b in accordance with the frequency-divided clock signal divCLK, a selection circuit 2b that selects one of selection data signals D0b and D1b in accordance with the frequency-divided clock signal divCLK, and a flip-flop 4b in an output circuit that latches a conversion data signal D[0+1]b in accordance with the output clock signal ffCLK and that outputs an output data signal OUTb.

That is, the parallel-to-serial converter in FIG. 12 is provided with a plurality of conversion circuits having substantially the same structure, and each conversion circuit is driven by commonly using the frequency-divided clock signal divCLK produced by the frequency divider circuit 3 and the arbitrary phase generation circuit 15 and the output clock signal ffCLK produced from the clock signal CLK. The common frequency-divided clock signal divCLK is phase-adjusted using a single replica circuit.

The replica clock signal repCLK supplied to the flip-flop 11 in the replica circuit and the output clock signal ffCLK supplied to the flip-flops 4a and 4b in the respective conversion circuits are signals that are divided from the same signal, namely, the clock signal CLK. Preferably, the replica clock signal repCLK and the output clock signal ffCLK are delivered to the flip-flops 4a, 4b, and 11 using isometric lines having a substantially equal wiring capacitance to prevent a phase deviation from occurring therebetween. However, as in FIG. 12, if a plurality of conversion circuits are provided, due to the layout design on an integrated circuit (IC) chip, it may be difficult to make the wiring length for the replica clock signal repCLK directed to the replica circuit equal to the wiring length for the output clock signal ffCLK directed to the conversion circuits. In addition, even when it is possible to make the lengths of the wirings substantially equal to each other, with the continued miniaturization of circuits, the influence of the difference between the input capacitances of flip-flops on the phase of clocks has increased.

A phase deviation between the replica clock signal repCLK and the output clock signal ffCLK will be described with reference to a timing chart of FIG. 13.

A replica circuit is a circuit that adjusts the phase of the frequency-divided clock signal divCLK with respect to the replica clock signal repCLK, but does not adjust the phase of the frequency-divided clock signal divCLK with respect to the output clock signal ffCLK. That is, the replica circuit is configured based on the assumption that there is no phase deviation between the replica clock signal repCLK and the output clock signal ffCLK that are generated from substantially the same signal, namely, the clock signal CLK. A phase deviation between the replica clock signal repCLK and the output clock signal ffCLK due to the reasons described above may cause the influence of the output clock signal ffCLK on the latch timing of the flip-flops 4a and 4b.

In the timing chart of FIG. 13, due to the reasons described above, the phase of the output clock signal ffCLK is delayed with respect to the replica clock signal repCLK. The phase of the frequency-divided clock signal divCLK is appropriately adjusted with respect to the replica clock signal repCLK using the replica circuit, and the conversion data signals D[0+1]a and D[0+1]b are output at appropriate timings using the selection circuits 2a and 2b in accordance with the frequency-divided clock signal divCLK. Meanwhile, the output clock signal ffCLK is delayed with respect to the replica clock signal repCLK because of the occurrence of a phase deviation. Thus, a rising edge of the output clock signal ffCLK is out of an appropriate timing for latching the conversion data signals D[0+1]a and D[0+1]b, that is, the margins illustrated in FIGS. 8A and 8B. This may cause, as described with reference to FIG. 8B, the flip-flops 4a and 4b to latch incorrect data, and the output data signals OUTa and OUTb, which are abnormal, are output.

A parallel data output device illustrated in FIG. 14 as well as a parallel-to-serial converter may also experience difficulties involved in a phase deviation of clock signals. The parallel data output device in FIG. 14 is provided to, for example, drive an optical modulator OM used in multilevel phase modulation methods. The optical modulator OM is an optical component that performs multilevel phase modulation of continuous light emitted from a light source LS using a Mach-Zehnder optical modulation circuit and that outputs a modulated optical signal. Parallel output data signals OUT0 and OUT1 that are produced by a parallel data output device are used as drive signals to be applied to a traveling wave electrode of the Mach-Zehnder optical modulation circuit. It is therefore desirable that the output data signals OUT0 and OUT1 produced by the parallel data output device be synchronous signals whose timings are made to match with high accuracy.

The parallel data output device is configured using flip-flops 20 and 21 serving as latch circuits that latch the input data signals IN0 and IN1 input thereto in parallel, respectively. The flip-flops 20 and 21 perform a latch operation in accordance with a rising edge of output clock signals ffCLK0 and ffCLK1 that are distributed from a single clock signal CLK, thereby outputting the output data signals OUT0 and OUT1 at a synchronous timing.

Since the output clock signals ffCLK0 and ffCLK1 are generated from substantially the same clock signal, namely, the clock signal CLK, a phase deviation is unlikely to occur between these signals. However, as described above, the influence of the difference between the input capacitances of the flip-flops 20 and 21 has increased in accordance with the continued miniaturization of circuits, resulting in a phase deviation being likely to occur between the output clock signals ffCLK0 and ffCLK1. A phase deviation between the output clock signals ffCLK0 and ffCLK1 may influence the deviation between the output timings of the output data signals OUT0 and OUT1. The deviation between the output timings of the output data signals OUT0 and OUT1 is illustrated in a timing chart of FIG. 15.

SUMMARY

According to an aspect of the invention, a parallel data output device includes a first latch circuit that latches and outputs one of at least two data signals input in parallel in accordance with a first clock signal; a second latch circuit that latches and outputs another of the at least two data signals in accordance with a second clock signal; and a phase set circuit that shifts at least one of a phase of the first clock signal and a phase of the second clock signal based on the phase of the first clock signal and the phase of the second clock signal.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 14:
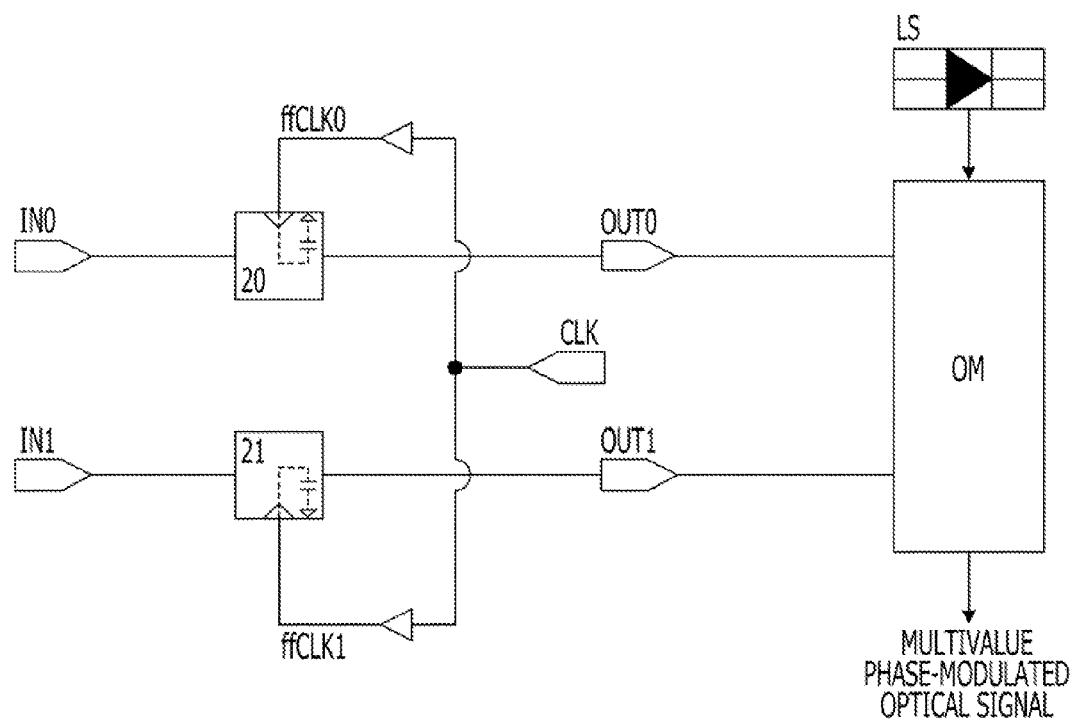
FIG. 14 illustrates a conventional parallel data output device.
Figure 15:
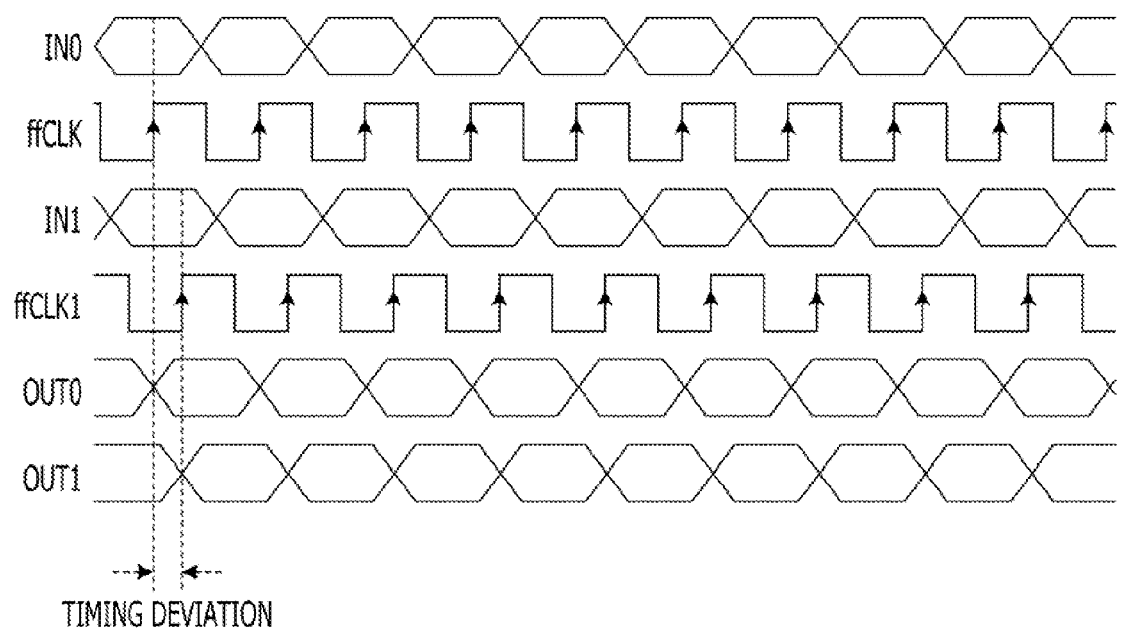
FIG. 15 is a timing chart for the parallel data output device illustrated in FIG. 14.

FIG. 15 is a timing chart for the parallel data output device illustrated in FIG. 14. In FIG. 15, a phase deviation occurs between the output clock signals ffCLK0 and ffCLK1 to the extent that the phase deviation has no effect on the latching of the input data signals IN0 and IN1 into the flip-flops 20 and 21. However, the phase deviation between the output clock signals ffCLK0 and ffCLK1 causes the deviation between the transition periods of the output data signals OUT0 and OUT1. With the increase in the data rate of the optical signal generated by the optical modulator OM, it is desirable that synchronization between the output data signals OUT0 and OUT1 using the parallel data output device be controlled at high accuracy.

In view of the situation described above, it is desirable to provide a parallel-to-serial converter and a parallel data output device in which a phase deviation between clock signals for driving latch circuits including flip-flops or the like is adjusted more accurately than conventionally done.

Figure 1:
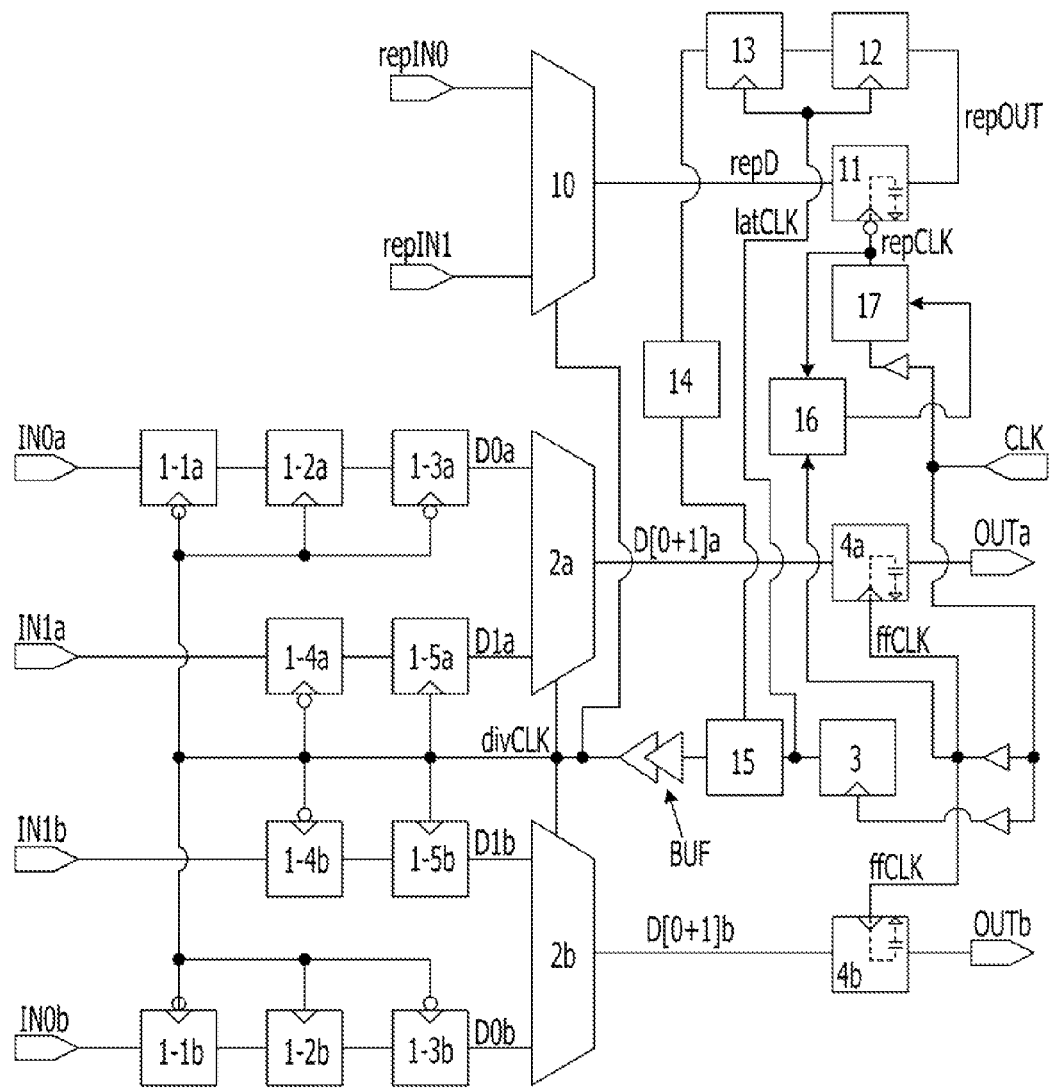
FIG. 1 illustrates a parallel-to-serial converter according to an embodiment.

A parallel-to-serial converter according to an embodiment illustrated in FIG. 1 includes a plurality of conversion circuits. Specifically, the parallel-to-serial converter in FIG. 1 includes two conversion circuits having substantially the same structure, each including an input circuit, a selection circuit, and an output circuit, by way of example.

A first conversion circuit includes (a) flip-flops 1-1a to 1-5a in an input circuit that latch and output input data signals IN0a and IN1a in accordance with a frequency-divided clock signal divCLK (corresponding to a first clock signal), (b) a selection circuit 2a that selects one of selection data signals D0a and D1a output from the flip-flops 1-3a and 1-5a, respectively, in accordance with the frequency-divided clock signal divCLK, and (c) a flip-flop 4a in an output circuit that latches a conversion data signal D[0+1]a in accordance with an output clock signal ffCLK (corresponding to a second clock signal) and that outputs an output data signal OUTa.

Further, a second conversion circuit has substantially the same structure, including (a) flip-flops 1-1b to 1-5b in an input circuit that latch and output input data signals IN0b and IN1b in accordance with the frequency-divided clock signal divCLK, (b) a selection circuit 2b that selects one of selection data signals D0b and D1b output from the flip-flops 1-3b and 1-5b, respectively, in accordance with the frequency-divided clock signal divCLK, and (c) a flip-flop 4b in an output circuit that latches a conversion data signal D[0+1]b in accordance with the output clock signal ffCLK and that outputs an output data signal OUTb.

In the input circuits, the input data signals IN0a/IN0b (hereinafter, a collection of the first conversion circuit represented by "a" and the second conversion circuit represented by "b" is represented using "/") are sequentially latched in the three cascade-connected flip-flops 1-1a/1-1b, 1-2a/1-2b, and 1-3a/1-3b, and are input to the selection circuits 2a/2b as selection data signals D0a/D0b. In the input circuits, the input data signals IN1a/IN1b are sequentially latched in the two cascade-connected flip-flops 1-4a/1-4b and 1-5a/1-5b, and are input to the selection circuits 2a/2b as the selection data signals D1a/D1b. The flip-flops 1-1a/1-1b to 1-5a/1-5b serving as latch circuits operate in accordance with the frequency-divided clock signal divCLK. The frequency-divided clock signal divCLK is obtained using a frequency divider circuit 3 by dividing a clock signal CLK whose frequency corresponds to the data rate of the output data signals OUTa/OUTb by half the frequency of the clock signal CLK. The flip-flops 1-2a/1-2b and 1-5a/1-5b execute setup and hold operations in accordance with a rising edge of the frequency-divided clock signal divCLK, and the flip-flops 1-1a/1-1b, 1-3a/1-3b, and 1-4a/1-4b execute setup and hold operations in accordance with a falling edge of the frequency-divided clock signal divCLK.

Therefore, the input data signals IN0a/IN0b and IN1a/IN1b are captured into the flip-flops 1-1a/1-1b and 1-4a/1-4b, respectively, in accordance with a falling edge of the frequency-divided clock signal divCLK, and are delivered to the subsequent flip-flops 1-2a/1-2b, 1-3a/1-3b, and 1-5a/1-5b for every half period of the frequency-divided clock signal divCLK.

Figure 7:
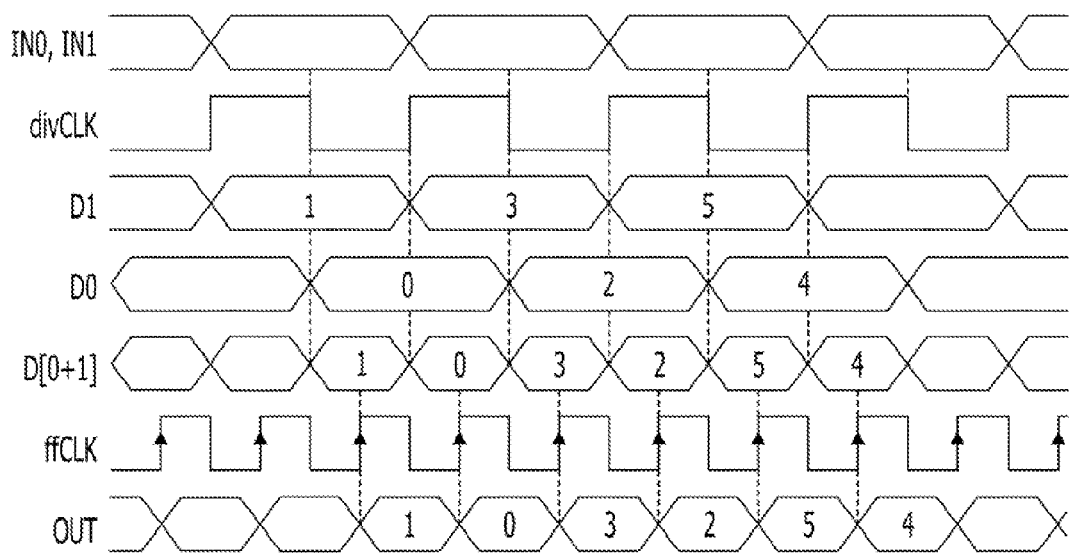
FIG. 7 is a timing chart for the parallel-to-serial converter illustrated in FIG. 6.
Figure 8A:
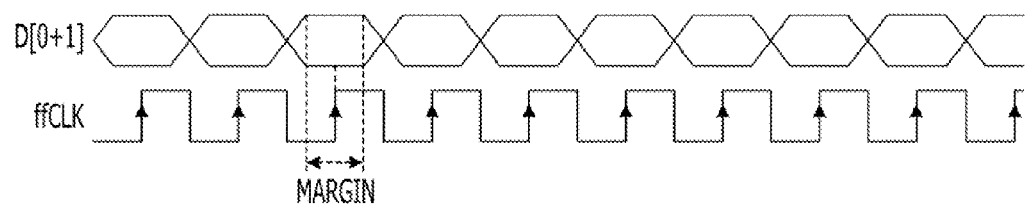
FIGS. 8A and 8B illustrate clock margins in data signals.
Figure 8B:
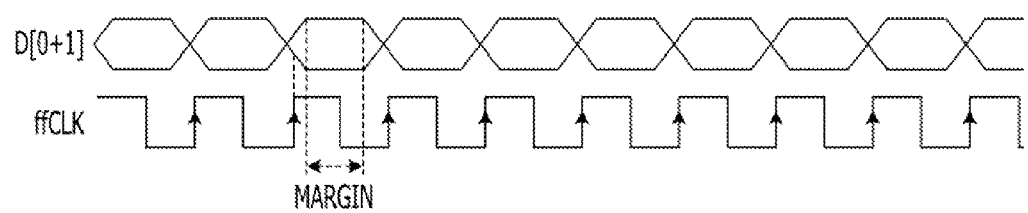
Figure 9:
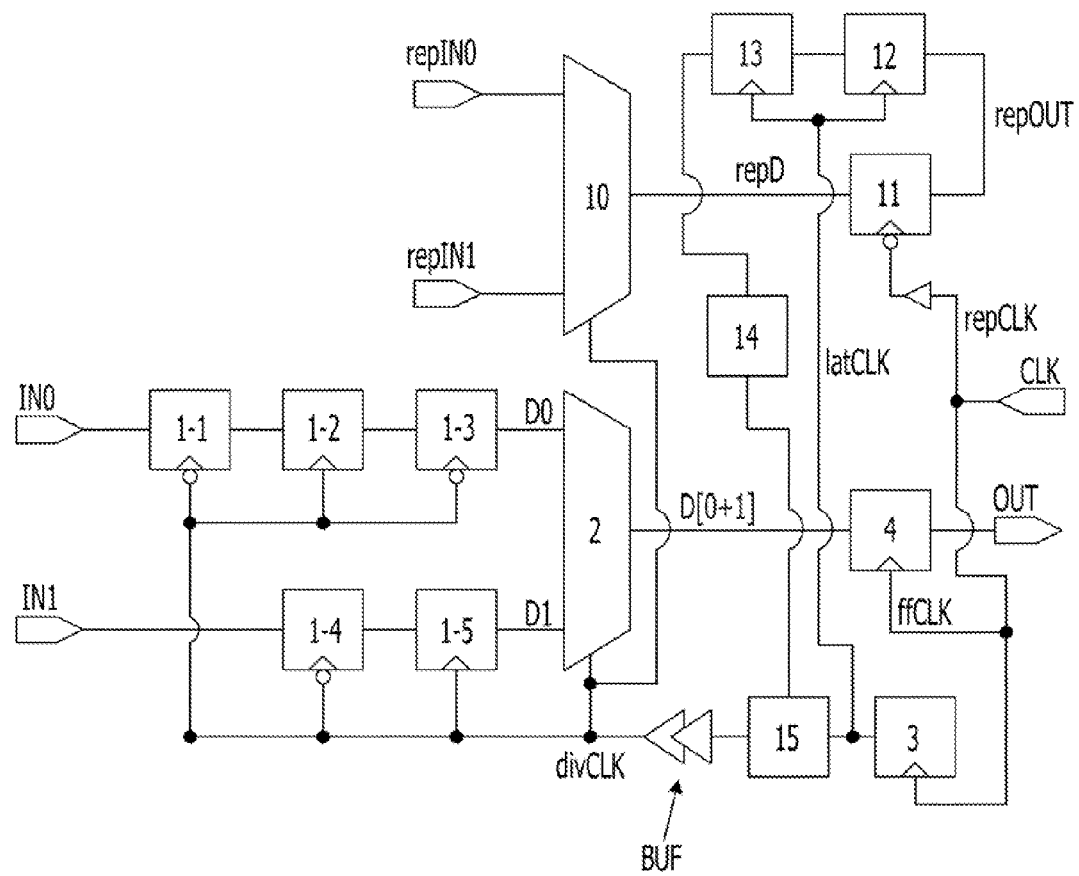
FIG. 9 illustrates a conventional parallel-to-serial converter including a replica circuit.
Figure 10:
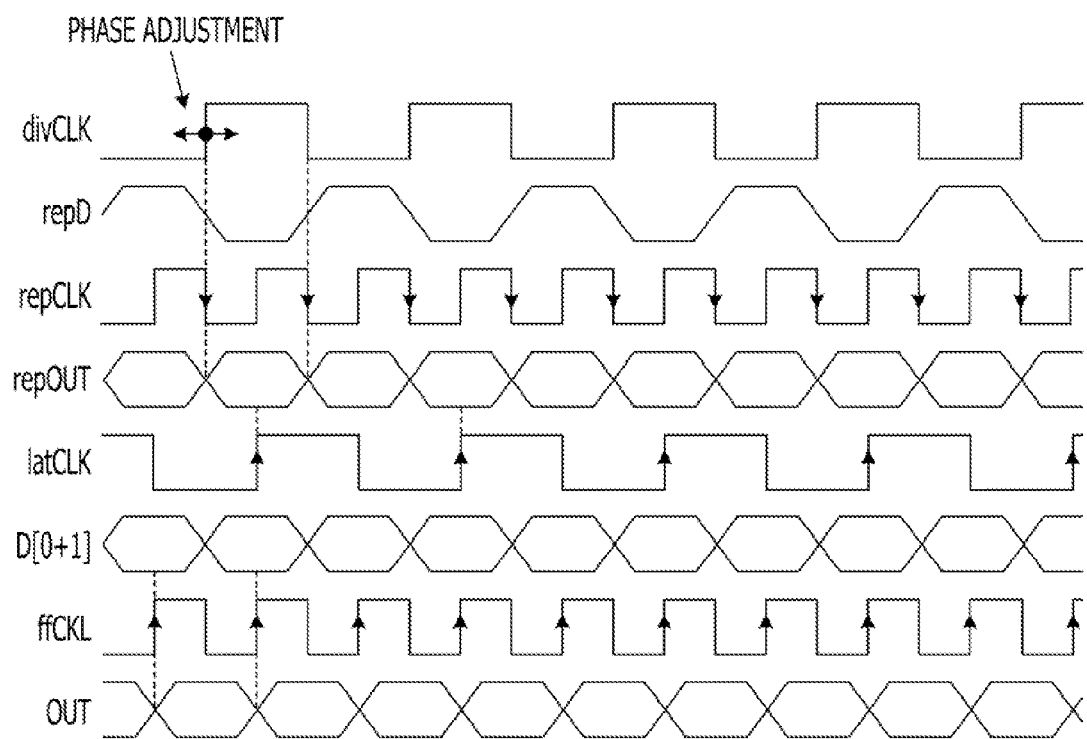
FIG. 10 is a timing chart for the parallel-to-serial converter illustrated in FIG. 9.
Figure 11A:
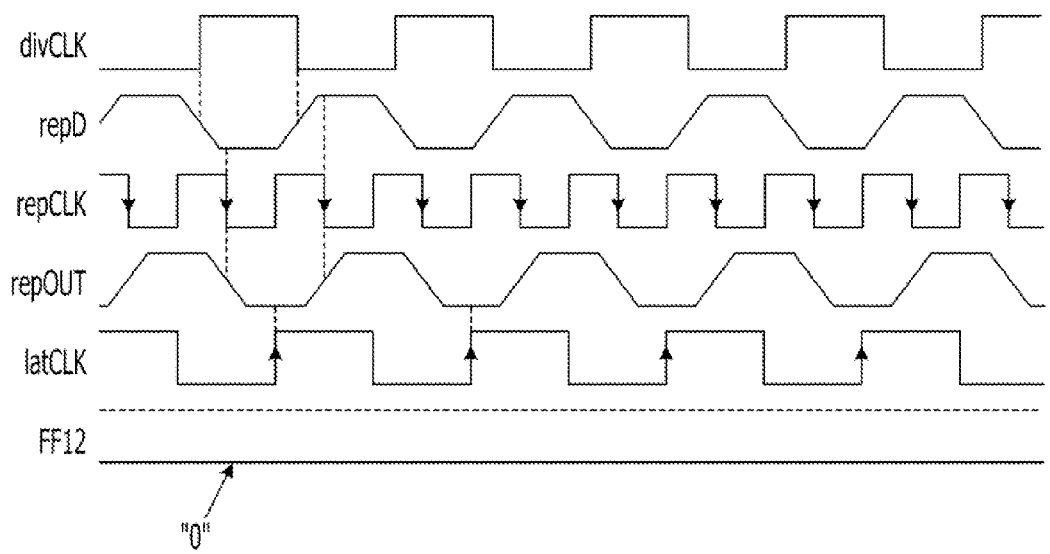
FIGS. 11A and 11B are timing charts illustrating the operation of the replica circuit.
Figure 11B:
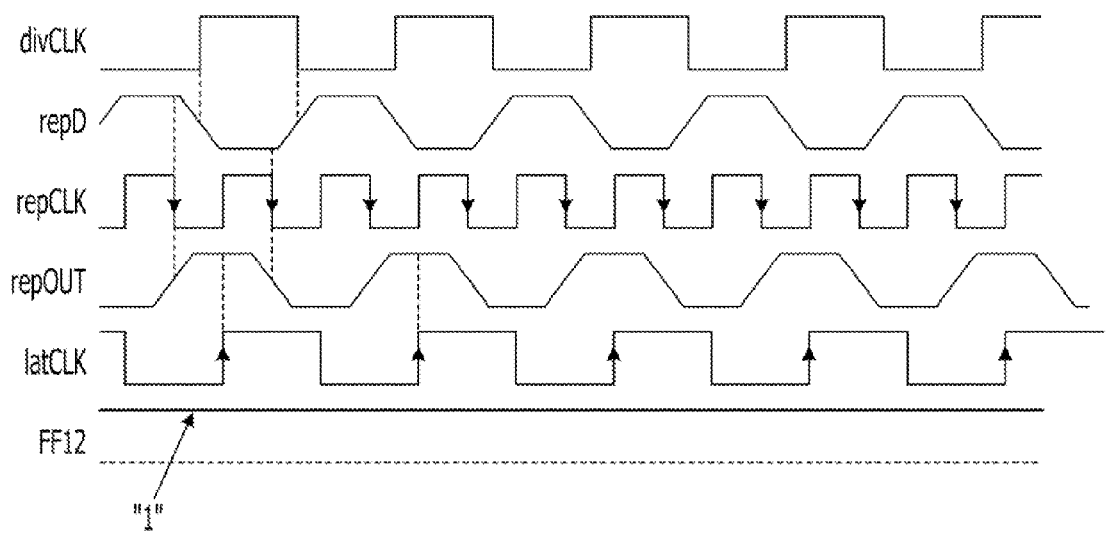
Figure 12:
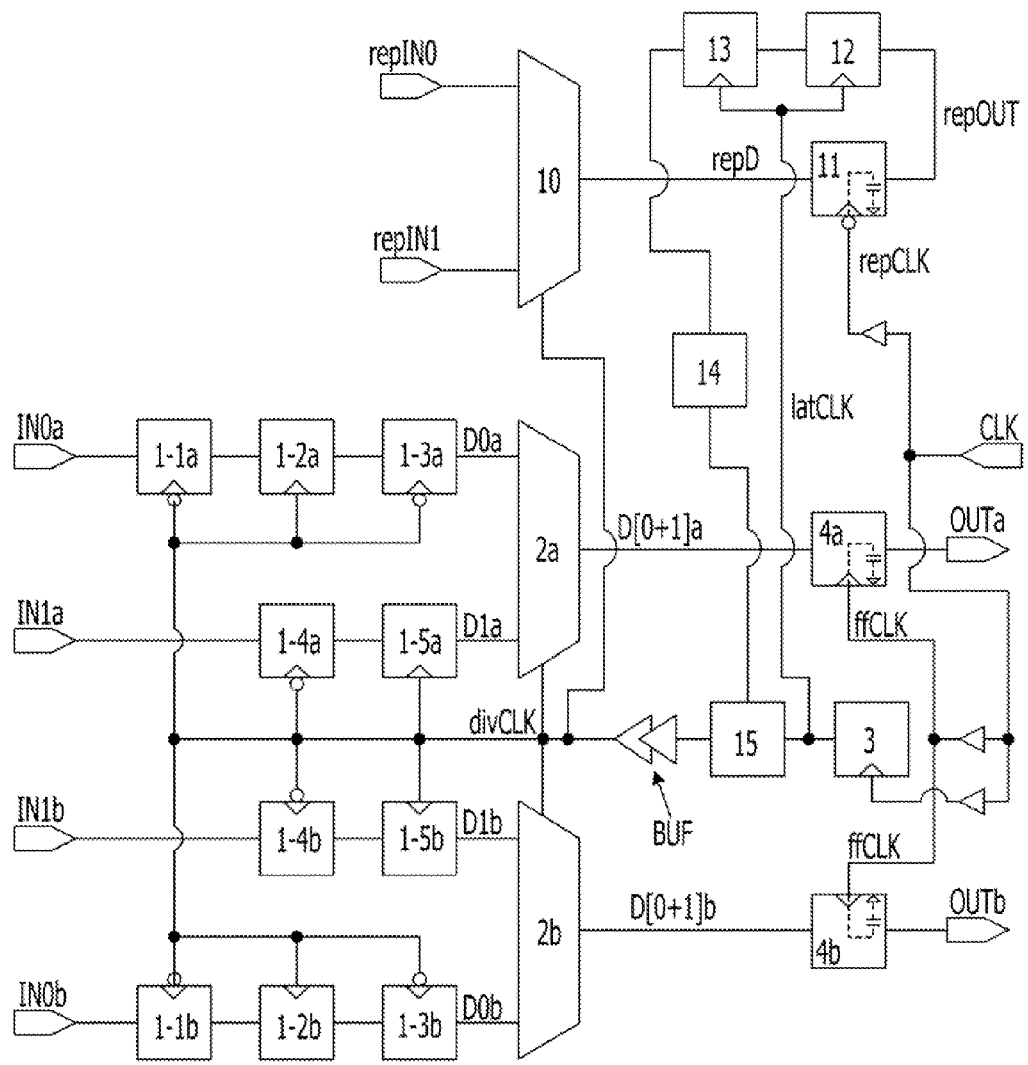
FIG. 12 illustrates a conventional parallel-to-serial converter including a replica circuit and a plurality of conversion circuits.
Figure 13:
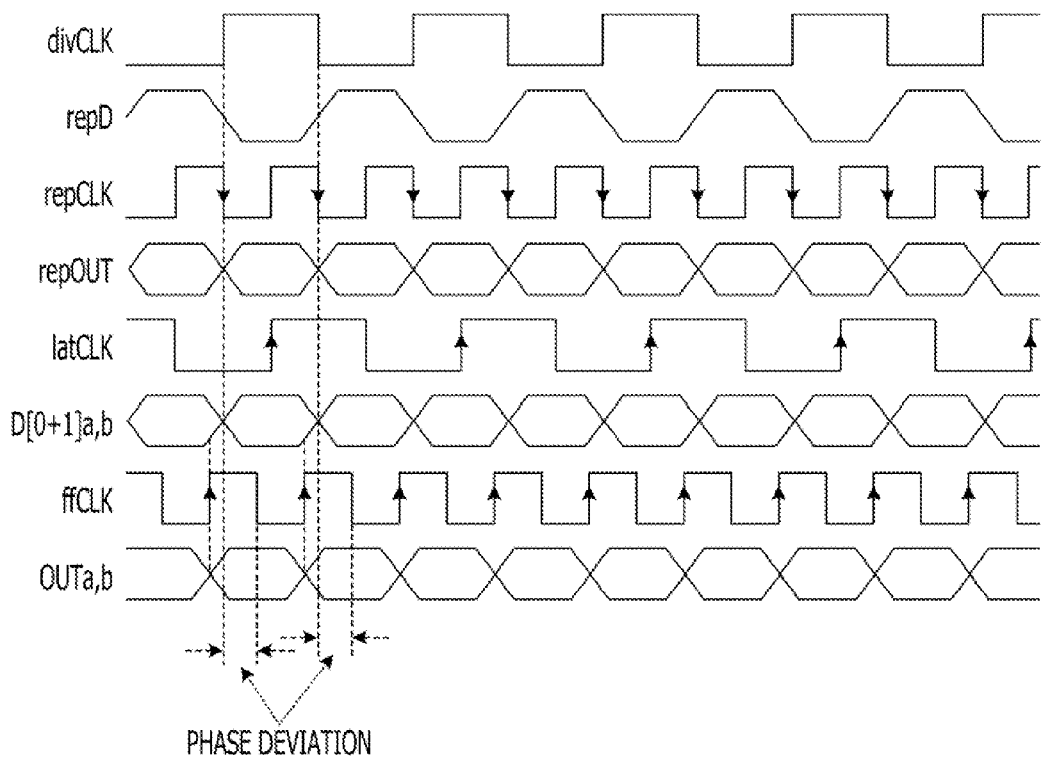
FIG. 13 is a timing chart for the parallel-to-serial converter illustrated in FIG. 12.

Consequently, the selection data signals D0a/D0b output through the three flip-flops 1-1a/1-1b, 1-2a/1-2b, and 1-3a/1-3b, and the selection data signals D1a/D1b output through the two flip-flops 1-4a/1-4b and 1-5a/1-5b are input to the selection circuits 2a/2b as signals whose phases are different by 180° from each other (see FIG. 7).

The selection circuits 2a/2b perform a switching operation in accordance with the frequency-divided clock signal divCLK supplied as a switching clock signal, and alternately selects the selection data signals D0a/D0b and D1a/D1b, thereby outputting the conversion data signals D[0+1]a/D[0+1]b that are obtained through serial conversion. For example, the selection circuits 2a/2b select the selection data signals D0a/D0b in accordance with a rising edge of the frequency-divided clock signal divCLK, and select the selection data signals D1a/D1b in accordance with a falling edge of the frequency-divided clock signal divCLK. Therefore, the conversion data signals D[0+1]a/D[0+1]b output from the selection circuits 2a/2b are output as serial data signals whose frequencies correspond to the frequency of the clock signal CLK whose frequency has not been divided.

The conversion data signals D[0+1]a/D[0+1]b are latched in the flip-flops 4a/4b in the output circuits that perform a latch operation in accordance with an output clock signal ffCLK having substantially the same cycle as the clock signal CLK, and the output data signals OUTa/OUTb are output from the flip-flops 4a/4b. The flip-flops 4a/4b execute setup and hold operations in accordance with a rising edge of the output clock signal ffCLK.

Figure 2:
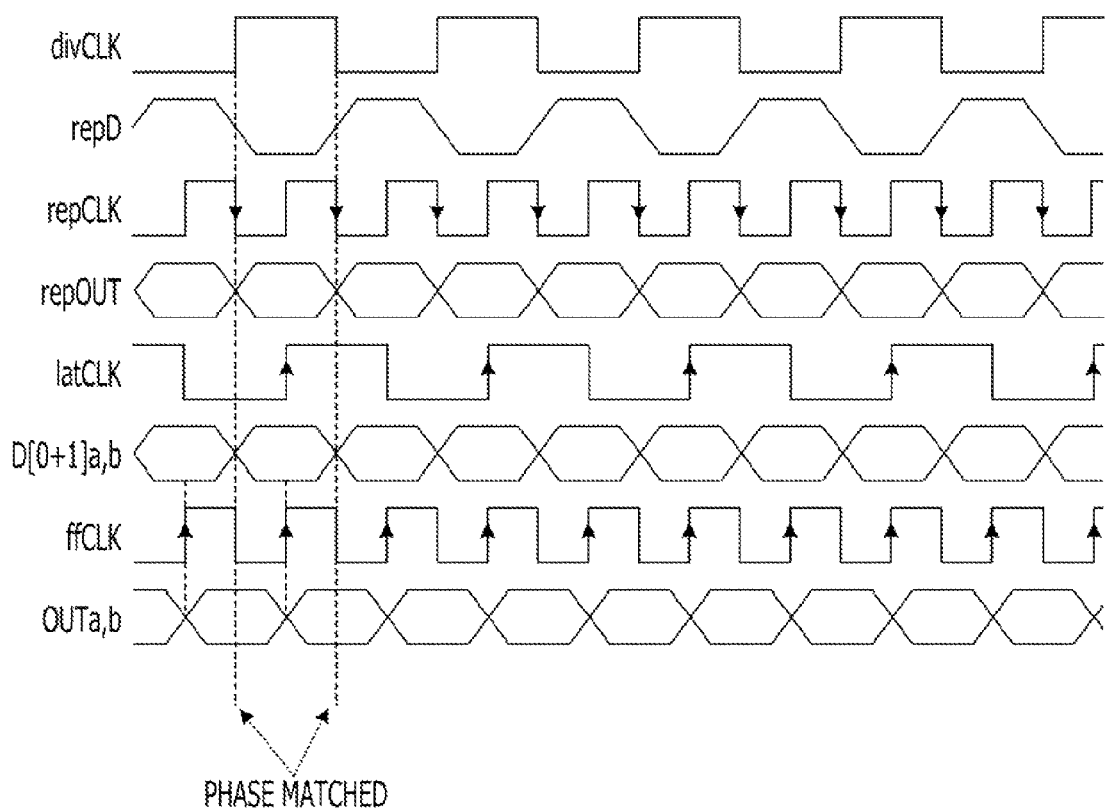
FIG. 2 is a timing chart for the parallel-to-serial converter illustrated in FIG. 1.

As illustrated in a timing chart of FIG. 2, the conversion data signals D[0+1]a/D[0+1]b output from the selection circuits 2a/2b are data signals in which the selection data signals D0a/D0b and D1a/D1b are switched alternately with the width of one pulse of the frequency-divided clock signal divCLK. The phases of the clock signals ffCLK and divCLK generated based on the clock signal CLK are adjusted in such a manner that a rising edge of the output clock signal ffCLK whose frequency is twice that of the frequency-divided clock signal divCLK is set at the center of each pulse of the frequency-divided clock signal divCLK. Therefore, the flip-flops 4a/4b latch data at optimum points (center of pulses) of the conversion data signals D[0+1]a/D[0+1]b, and the output data signals OUTa/OUTb are output.

A replica circuit includes (a) a selection circuit (replica selection circuit) 10 that selects one of replica input data signals repIN0 and repIN1 in accordance with the frequency-divided clock signal divCLK, and (b) a flip-flop 11 serving as a replica output circuit that latches a replica conversion data signal repD, which is obtained through serial conversion and output from the selection circuit 10, in accordance with an output replica clock signal repCLK.

The selection circuit 10 has substantially the same structure as the selection circuits 2a/2b, and is supplied with the same signal as the frequency-divided clock signal divCLK as a switching clock signal. The flip-flop 11 has substantially the same structure as the flip-flops 4a/4b. Like the output clock signal ffCLK, the replica clock signal repCLK supplied to the flip-flop 11 is a signal having substantially the same cycle as the clock signal CLK. However, the flip-flop 11 executes setup and hold operations in accordance with a falling edge of the replica clock signal repCLK.

A phase deviation detection circuit configured using a flip-flop 12 and a counter 13 generates a phase adjustment instruction value signal based on a replica output data signal repOUT output from the flip-flop 11, and the phase of the frequency-divided clock signal output from the frequency divider circuit 3 is adjusted based on the phase adjustment instruction value signal. In this example, the replica output data signal repOUT is latched in the flip-flop 12 in accordance with a latch clock signal latCLK that is a clock signal whose frequency has been divided by the frequency divider circuit 3, and the counter 13 executes counting using this latched value. Thus, a count value as a phase adjustment instruction value signal is output.

Specifically, as illustrated in the timing chart of FIG. 2, the replica output data signal repOUT output from the flip-flop 11 is captured into the flip-flop 12 provided as a latch circuit in accordance with the latch clock signal latCLK whose frequency has been divided by half the frequency of the clock signal CLK. The flip-flop 12 executes setup and hold operations in accordance with a rising edge of the latch clock signal latCLK. The counter 13 counts up or counts down in accordance with the latched value of the flip-flop 12 in synchronization with the latch clock signal latCLK. For example, in accordance with a rising edge of the latch clock signal latCLK, the count value is increased by 1 if the current output value of the flip-flop 12 is "1", and the count value is decreased by 1 if the output value is "0".

The count value output from the counter 13 as a phase adjustment instruction value signal is decoded at a desired time using a decoder 14, and is converted into an appropriate code (for example, a thermometer code). Based on the code, an arbitrary phase generation circuit 15 adjusts the phase of the frequency-divided clock signal output from the frequency divider circuit 3, and generates a frequency-divided clock signal divCLK. The arbitrary phase generation circuit 15 serving as a phase interpolation circuit outputs a frequency-divided clock signal divCLK whose phase has been adjusted, by, for example, weighting multiphase frequency-divided clock signals having substantially the same cycle as the frequency-divided clock signal output from the frequency divider circuit 3 and having phases different by 90° from each other in accordance with the code supplied from the decoder 14 and superposing the weighted clock signals.

Replica input data signals repIN0 and repIN1 are input as data signals one of which is fixed to "0" and the other of which is fixed to "1". Therefore, the replica conversion data signal repD output from the selection circuit 10 transitions between "0" and "1" every half period of the frequency-divided clock signal divCLK. The flip-flop 11 performs a latch operation in accordance with a falling edge of the replica clock signal repCLK whose frequency is twice that of the frequency-divided clock signal divCLK. Thus, the flip-flop 11 executes a latch for the transition period of the replica conversion data signal repD, and generates a replica output data signal repOUT. Therefore, the replica output data signal repOUT that is latched in and output from the flip-flop 11 does not appear in a predictable pattern, and is a data signal in which "0" and "1" appear randomly with substantially the same probability.

The latch clock signal latCLK supplied to the flip-flop 12 is a signal that has just been output from the frequency divider circuit 3, that is, a signal that has not yet passed through the arbitrary phase generation circuit 15 and a buffer BUF, and the flip-flop 12 that operates in accordance with the latch clock signal latCLK is allowed to execute a latch at any timing out of the transition period of the replica output data signal repOUT. Since, as described above, the replica output data signal repOUT latched in the flip-flop 12 is a data signal in which "0" and "1" appear randomly, the flip-flop 12 may latch "0" or "1" with substantially the same probability. As a result of "0" or "1" being latched in the flip-flop 12 with substantially the same probability, the count value of the counter 13 that counts the value "0" or "1" is maintained at a substantially constant value and is made stable although the count value may go up and down slightly. In accordance with the stable count value, a decoding value output from the decoder 14 is also made stable, and the frequency-divided clock signal divCLK output from the arbitrary phase generation circuit 15 in accordance with the decoding value is made stable.

The parallel-to-serial converter according to this embodiment further includes a phase set circuit including a phase comparison circuit 16 and a phase shift circuit 17. The phase set circuit is a circuit that shifts the phase of at least one of the output clock signal ffCLK and the replica clock signal repCLK based on the phase of the output clock signal ffCLK and the phase of the replica clock signal repCLK. In this embodiment, the phase set circuit shifts the phase of the replica clock signal repCLK, by way of example.

The phase comparison circuit 16 compares the output clock signal ffCLK with the replica clock signal repCLK, and generates an output signal indicating a phase comparison result. In an embodiment, the line through which the output clock signal ffCLK is transmitted to the phase comparison circuit 16 and the line through which the replica clock signal repCLK is transmitted to the phase comparison circuit 16 are designed as isometric lines so as to have an equal wiring capacitance. The phase shift circuit 17 shifts the phase of the replica clock signal repCLK in accordance with an output signal of the phase comparison circuit 16, and provides the flip-flop 11 with the resulting replica clock signal repCLK. The phase set circuit including the phase comparison circuit 16 and the phase shift circuit 17 allows the phase of the output clock signal ffCLK to match the phase of the replica clock signal repCLK in the manner illustrated in FIG. 2. That is, as described previously, a phase deviation may occur between the output clock signal ffCLK and the replica clock signal repCLK due to the input capacitances of the flip-flops 4a/4b and 11 or the wiring capacitances. However, the phase set circuit allows the phase of the replica clock signal repCLK to be shifted so that the phases of the output clock signal ffCLK and the replica clock signal repCLK are made to match.

The shifting of the phase of the replica clock signal repCLK may cause a phase deviation between the replica clock signal repCLK and the frequency-divided clock signal divCLK. The phase deviation may be addressed by adjusting the phase of the frequency-divided clock signal divCLK using the arbitrary phase generation circuit 15.

Figure 3:
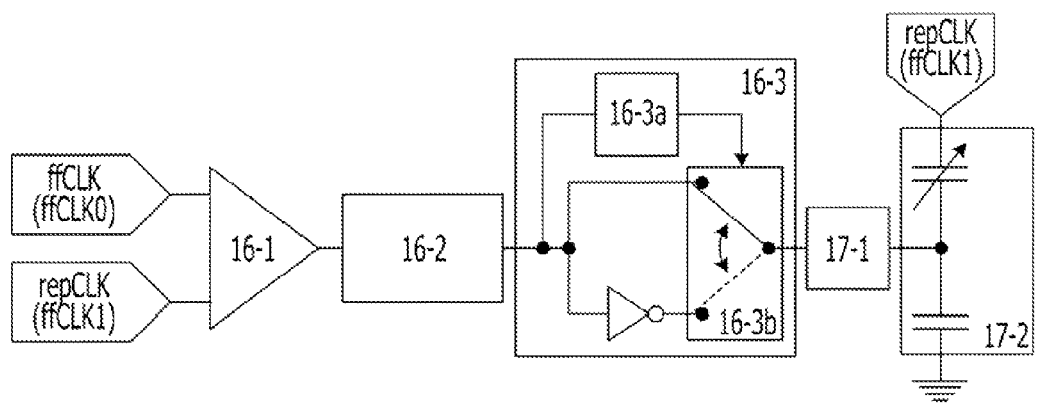
FIG. 3 illustrates a parallel data output device according to an embodiment.

FIG. 3 illustrates a specific example of the phase comparison circuit 16 and the phase shift circuit 17 which are used to shift the phase of the replica clock signal repCLK in accordance with phase comparison. The phase comparison circuit 16 in FIG. 3 is configured using a comparator 16-1, an amplitude detection circuit 16-2, and an increase/decrease detection circuit 16-3. The phase shift circuit 17 is configured using a charge pump 17-1 and a capacitor 17-2.

The comparator 16-1 receives the output clock signal ffCLK and the replica clock signal repCLK, compares the phases thereof, and outputs a phase difference signal having an amplitude according to the phase difference therebetween. The comparator 16-1 operates at a high speed in accordance with the output clock signal ffCLK and the replica clock signal repCLK which have high frequencies. The phase difference signal output from the comparator 16-1 is input to the amplitude detection circuit 16-2, and the amplitude thereof is detected. The amplitude detection circuit 16-2 outputs a detection signal of a voltage corresponding to the detected amplitude.

The increase/decrease detection circuit 16-3 includes an increase/decrease detection unit 16-3a and a switching unit 16-3b. The increase/decrease detection unit 16-3a is configured using an operational amplifier or the like, and detects whether the voltage of the detection signal output from the amplitude detection circuit 16-2 is increasing or decreasing, and outputs a switching signal in accordance with the increase or decrease in voltage. The switching unit 16-3b performs switching in accordance with the switching signal generated by the increase/decrease detection unit 16-3a, selects one of the signals supplied to two input terminals, and outputs the selected signal. The detection signal of the amplitude detection circuit 16-2 is input to one of the input terminals of the switching unit 16-3b, and an inverted detection signal of the amplitude detection circuit 16-2, which is obtained by an inverter, is input to the other input terminal. Therefore, an output signal of the increase/decrease detection circuit 16-3 is output as a signal whose voltage and polarity differ depending on the increase or decrease in the amplitude detected by the amplitude detection circuit 16-2.

The charge pump 17-1 operates in accordance with the output signal of the increase/decrease detection circuit 16-3 to perform charging or discharging. The capacitor 17-2 serves as a variable capacitor whose capacitance varies in accordance with the operation of the charge pump 17. As illustrated in FIG. 1, one end of the capacitor 17-2 is connected to a clock input terminal of the flip-flop 11 or to a line to the flip-flop 11, and the replica clock signal repCLK is applied. Therefore, as the capacitance of the capacitor 17-2 changes, the phase of the replica clock signal repCLK supplied to the flip-flop 11 changes.

The configuration described above allows the phase comparison circuit 16 to operate so as to minimize the phase difference signal output from the comparator 16-1. Thus, due to the change in the capacitance of the phase shift circuit 17 accordingly, the phase of the replica clock signal repCLK is adjusted so as to match the phase of the output clock signal ffCLK.

While a circuit including a variable capacitor is illustrated as a specific example of the phase shift circuit 17, various other circuits capable of shifting the phase of a clock signal, such as a circuit including a variable delay line, may be used. However, in terms of response characteristics or integration into a chip, a circuit including a capacitor having a variable capacitance may be suitable.

Figure 4:
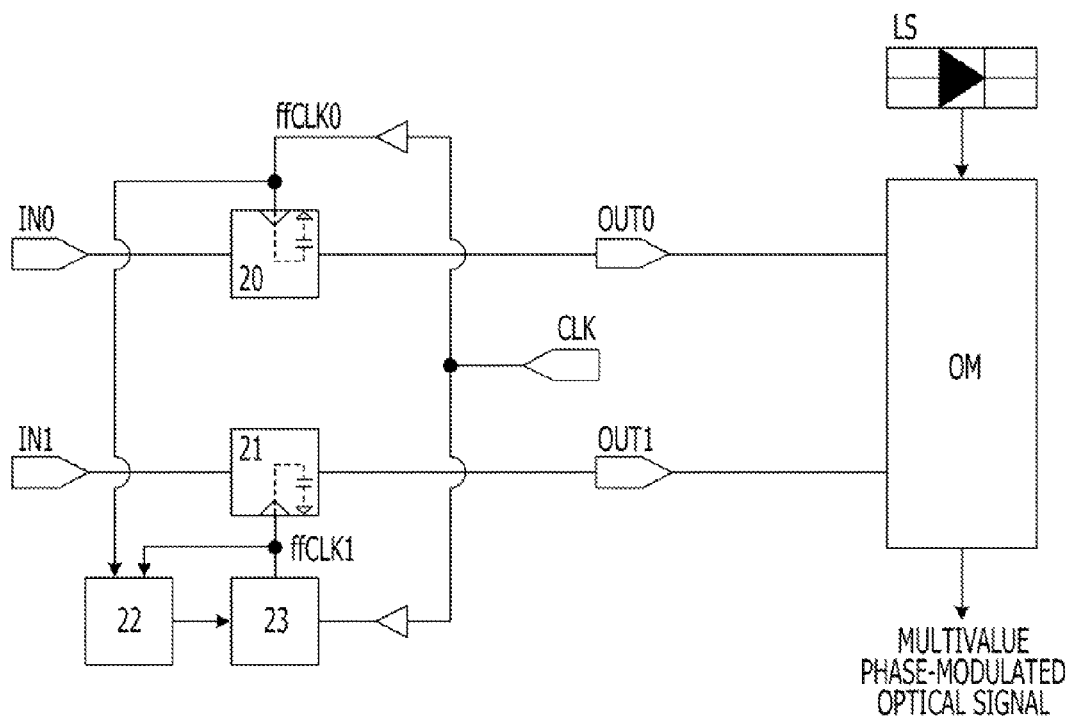
FIG. 4 is a timing chart for the parallel data output device illustrated in FIG. 3.

FIG. 4 illustrates an embodiment in which a phase set circuit is used in a parallel data output device.

The parallel data output device in FIG. 4 is provided to, by way of example, drive an optical modulator OM used in multilevel phase modulation methods. The optical modulator OM is an optical component that performs multilevel phase modulation of continuous light emitted from a light source LS using a Mach-Zehnder optical modulation circuit and that outputs a modulated optical signal. Parallel output data signals OUT0 and OUT1 that are produced by a parallel data output device are used as drive signals to be applied to a traveling wave electrode of the Mach-Zehnder optical modulation circuit.

The parallel data output device is configured using two flip-flops 20 and 21 serving as two latch circuits that latch a plurality of input data signals input in parallel, for example, two input data signals IN0 and IN1, respectively. The flip-flops 20 and 21 perform a latch operation in accordance with a rising edge of output clock signals ffCLK0 and ffCLK1 that are distributed from a single clock signal CLK, thereby outputting the output data signals OUT0 and OUT1 at a synchronous timing. That is, the parallel data output device is configured to include the flip-flop 20 serving as a first latch circuit that latches and outputs the input data signal IN0 in accordance with the output clock signal ffCLK0 (corresponding to a first clock signal), and the flip-flop 21 serving as a second latch circuit that latches and outputs the input data signal IN1 in accordance with the output clock signal ffCLK1 (corresponding to a second clock signal). The lines through which the output clock signals ffCLK0 and ffCLK1 are supplied to the flip-flops 20 and 21, respectively, are designed as isometric lines so as to obtain a substantially equal wiring capacitance.

The output clock signals ffCLK0 and ffCLK1 are signals generated from a single clock signal CLK. However, with the continued miniaturization of circuits, a phase deviation may occur due to the difference between the input capacitances of the flip-flops 20 and 21. Thus, the phase set circuit is provided to address a phase deviation that may occur between the output clock signals ffCLK0 and ffCLK1.

The phase set circuit in FIG. 4 is configured to include a phase comparison circuit 22 and a phase shift circuit 23, and is a circuit that shifts at least one of the phases of the output clock signal ffCLK0 and the output clock signal ffCLK1 based on the phase of the output clock signal ffCLK0 and the phase of the output clock signal ffCLK1. In this embodiment, the phase set circuit shifts the phase of the output clock signal ffCLK1, by way of example.

Figure 5:
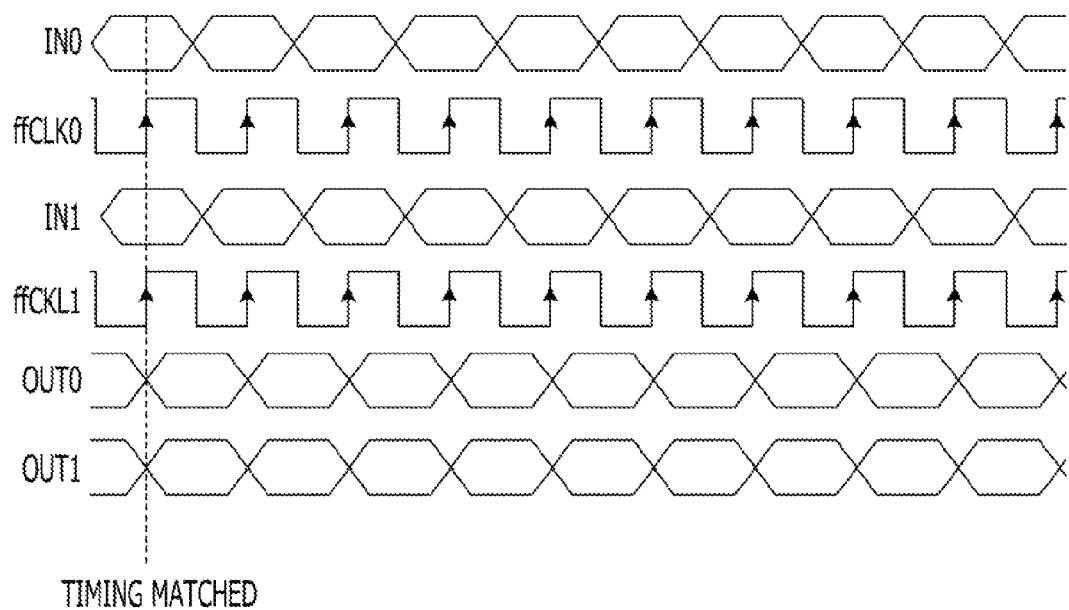
FIG. 5 illustrates a specific example of a phase set circuit.
Figure 6:
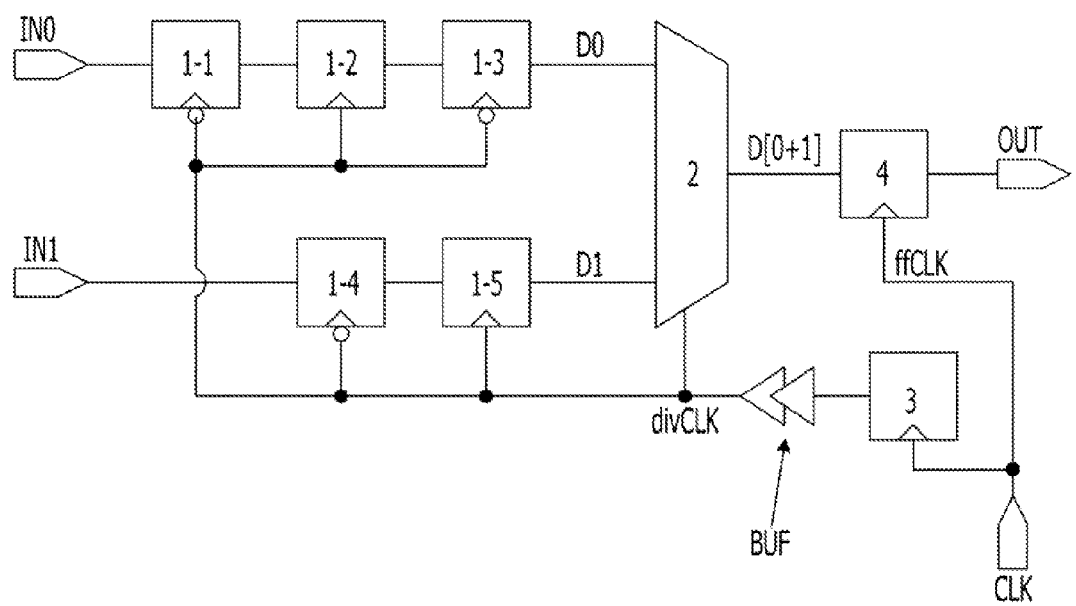
FIG. 6 illustrates a conventional parallel-to-serial converter.

The phase comparison circuit 22 and the phase shift circuit 23 have a similar configuration to that of the phase comparison circuit 16 and the phase shift circuit 17 according to an embodiment illustrated in FIGS. 1 and 3, respectively. Specifically, the phase comparison circuit 22 compares the output clock signal ffCLK0 with the output clock signal ffCLK1, and generates an output signal indicating a phase comparison result. The phase shift circuit 23 shifts the phase of the output clock signal ffCLK1 in accordance with an output signal of the phase comparison circuit 22, and provides the flip-flop 21 with the resulting output clock signal ffCLK1. Therefore, as illustrated in FIG. 5, the phase of the output clock signal ffCLK0 is made to match the phase of the output clock signal ffCLK1. In an embodiment, the lines through which the output clock signals ffCLK0 and ffCLK1 are transmitted to the phase comparison circuit 22 are designed as isometric lines so as to obtain a substantially equal wiring capacitance.

Advantageous Effects of Invention

In a parallel-to-serial converter according to the proposal described above, a phase set circuit performs phase shifting, thus making it possible to adjust a replica clock signal and a second clock signal so that the phases of the replica clock signal and the second clock signal are made to match. Therefore, abnormality is less likely to occur in a data signal output from an output circuit than in conventional devices.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

What is claimed is:

1. A parallel-to-serial converter comprising:
    an input circuit that latches and outputs a plurality of data signals input in parallel in accordance with a first clock signal;
    a selection circuit that selects one of the plurality of data signals output in parallel from the input circuit in accordance with the first clock signal and that outputs a converted serial data signal;
    an output circuit that latches and outputs the data signal output from the selection circuit in accordance with a second clock signal;
    a frequency divider circuit that divides a frequency of a clock signal, on which the second clock signal is based, to generate the first clock signal;
    a replica circuit including
        a replica selection circuit that selects one of a plurality of data signals replica of the plurality of data signals input to the input circuit in accordance with the first clock signal and that outputs a converted serial replica data signal,
        a replica output circuit that latches and outputs the replica data signal output from the replica selection circuit in accordance with a replica clock signal having a cycle substantially identical to a cycle of the second clock signal, and
    a phase set circuit that shifts at least one of a phase of the second clock signal and a phase of the replica clock signal based on the phase of the second clock signal and the phase of the replica clock signal.

2. The parallel-to-serial converter according to claim 1, wherein the phase set circuit includes
    a phase comparison circuit that compares the phase of the second clock signal with the phase of the replica clock signal, and
    a phase shift circuit that shifts at least one of the phase of the second clock signal and the phase of the replica clock signal in accordance with an output signal of the phase comparison circuit.

3. The parallel-to-serial converter according to claim 2, wherein the phase comparison circuit includes
    a comparator that outputs a phase difference signal having an amplitude according to a phase difference between the second clock signal and the replica clock signal,
    an amplitude detection circuit that detects the amplitude of the phase difference signal, and
    an increase/decrease detection circuit that generates an output signal directed to the phase shift circuit in accordance with an increase or decrease in the amplitude detected by the amplitude detection circuit.

4. The parallel-to-serial converter according to claim 2, wherein the phase shift circuit includes
    a charge pump that operates in accordance with an output signal of the phase comparison circuit, and
    a capacitor having a variable capacitance according to the charge pump.

5. The parallel-to-serial converter according to claim 1, further comprising:
    a phase deviation detection circuit that generates a phase adjustment instruction value signal based on the replica data signal output from the replica output circuit, and
    an arbitrary phase generation circuit that adjusts a phase of a frequency-divided clock signal output from the frequency divider circuit based on the phase adjustment instruction value signal and that generates the first clock signal.

6. A parallel data output device comprising:
    a first latch circuit that latches and outputs one of at least two data signals input in parallel in accordance with a first clock signal;
    a second latch circuit that latches and outputs another of the at least two data signals in accordance with a second clock signal; and
    a phase set circuit that shifts at least one of a phase of the first clock signal and a phase of the second clock signal based on the phase of the first clock signal and the phase of the second clock signal.

7. The parallel data output device according to claim 6, wherein the phase set circuit includes
    a phase comparison circuit that compares the phase of the first clock signal with the phase of the second clock signal, and
    a phase shift circuit that shifts at least one of the phase of the first clock signal and the phase of the second clock signal in accordance with an output signal of the phase comparison circuit.

8. The parallel data output device according to claim 7, wherein the phase comparison circuit includes
    a comparator that outputs a phase difference signal having an amplitude according to a phase difference between the first clock signal and the second clock signal,
    an amplitude detection circuit that detects the amplitude of the phase difference signal, and
    an increase/decrease detection circuit that generates an output signal directed to the phase shift circuit in accordance with an increase or decrease in the amplitude detected by the amplitude detection circuit.

9. The parallel data output device according to claim 7, wherein the phase shift circuit includes
    a charge pump that operates in accordance with an output signal of the phase comparison circuit, and
    a capacitor having a variable capacitance according to the charge pump.

* * * * *